US005587233A

United States Patent [19]
König et al.

[11] Patent Number: 5,587,233
[45] Date of Patent: Dec. 24, 1996

[54] COMPOSITE BODY AND ITS USE

[75] Inventors: Udo König, Essen, Germany; Hendrikus Van Den Berg, Venlo-Blerick, Netherlands; Ralf Tabersky, Bottrop, Germany

[73] Assignee: Widia GmbH, Essen, Germany

[21] Appl. No.: 295,902

[22] PCT Filed: Jan. 21, 1993

[86] PCT No.: PCT/DE93/00047

§ 371 Date: Aug. 30, 1994

§ 102(e) Date: Aug. 30, 1994

[87] PCT Pub. No.: WO93/20257

PCT Pub. Date: Oct. 14, 1993

[30] Foreign Application Priority Data

Mar. 27, 1992 [DE] Germany ............... 42 09 975.7

[51] Int. Cl.⁶ ............................................. B32B 18/00
[52] U.S. Cl. ................. 428/325; 427/314; 427/318; 427/327; 427/569; 427/576; 427/585; 428/329; 428/336; 428/472.2; 428/698; 428/699
[58] Field of Search ........................... 427/576, 585, 427/314, 318, 327, 569; 428/325, 329, 336, 698, 699, 472.2

[56] References Cited

FOREIGN PATENT DOCUMENTS

| | | |
|---|---|---|
| 0408535A1 | 1/1991 | European Pat. Off. . |
| 0423390A1 | 4/1991 | European Pat. Off. . |
| 3738450C2 | 6/1989 | Germany . |
| 298003A5 | 1/1992 | Germany . |
| 56-16665 | 2/1981 | Japan . |
| 59-25971 | 2/1984 | Japan . |
| 59-28565 | 2/1984 | Japan . |
| 63-195268 | 8/1988 | Japan . |
| 1-83662 | 3/1989 | Japan . |
| 1-180980 | 7/1989 | Japan . |
| 667316 | 6/1979 | U.S.S.R. . |
| WO90/06380 | 6/1990 | WIPO . |

OTHER PUBLICATIONS

"Physical and Chemical Properties of Aluminum Oxide Film Deposited b AlCl3–CO2–H2 System" by Iida et al. (Japanese Journal of Applied Physics vol. 11, No. 6 Jun. 1972.

"Carbon–Doped aplha–Al2O3 Films Synthesized on Cemented Carbide Tools by the Metal Organic LPCVD Technique" by A. Kwatera (2194 Thin Solid Films, 200 (1991) May/1, No. 1, Lausanne.

"Properties of Aluminium Oxide Films Prepared by Plasma–Enhanced Metal–Organic Vapour Deposition" Chang et al. (2194 Thin Solid Films 189 (1990) Aug. 1, No. 1 Lausanne.

Primary Examiner—Bernard Pianalto
Attorney, Agent, or Firm—Herbert Dubno

[57] ABSTRACT

Composite body consisting of a hard metal, steel, ceramic, particularly sintered ceramic or cermet substrate body or a substrate body made of diamond or a nickel or cobalt-based alloy and of one or more surface layers, of which at least one, preferably the outer layer, consists of $Al_2O_3$ with a fine crystalline structure, which has been applied by means of a plasma CVD process at substrate temperatures of 400° C. to 750°, preferably 450° C. to 550°, with a substrate body connected as cathode and with a plasma activation produced with a pulsed direct voltage.

14 Claims, 4 Drawing Sheets

COMPOSITE BODY AND ITS USE

CROSS REFERENCE TO RELATED APPLICATIONS

This application is a national phase of PCT/DE 93 00 047 filed 21 Jan. 1993 and based upon German national application P 42 09 975.7 of 27 Mar. 1992 under the International Convention.

FIELD OF THE INVENTION

The invention relates to a composite body, consisting of a substrate body made of ceramic, sintered ceramic or cermet or of a substrate body made of diamond or a nickel- or cobalt-based alloy with one or more surface layers and its use.

BACKGROUND OF THE INVENTION

DE 22 33 700 C2 discloses coating hard metal substrate bodies consisting of a mixture of at least one metal serving as a bonding agent and at least one very hard metal carbide of high with a layer of aluminum oxide or zirconium oxide. Particularly the substrate body can be made of tungsten carbide, titanium carbide, tantalum carbide or niobium carbide, or, a compound carbide consisting of tantalum and niobium, whereby the metals cobalt, iron or nickel serve as bonding agent. In the literature hard metals based titanium carbide or titanium carbonitride are frequently mentioned as cermets, which are also to be understood as substrate materials, just like the pure combinations of a hard metal with ceramic, i.e. nonmetallic, components. According to the DE 22 33 700 C2 the mentioned layers of α-aluminum oxide are applied by means of CVD at substrate temperatures of 1000° C.

A corresponding layer may be applied to the hard metal bodies according to the DE 22 53 745 A1, which consist of a sintered hard metal substrate body, intermediate layers of titanium carbide and an outer layer of aluminum oxide, whereby the first titanium carbide intermediate layer has to be applied at 1000° C. and the second aluminum oxide layer at 1110° C. by a CVD process. As mentioned especially in DE 28 25 009, column 2, lines 28 and following, hard, polycrystalline and compact α-aluminum oxide layer are normally produced only at deposition temperatures of 950° C. At lower deposition temperatures, according to the state of the art, loose and powdery depositions are obtained, which consist of the γ modification and/or α modification of the aluminum oxide. At deposition temperatures of approximately 1000° C. and above, the aluminum oxide phase is normally the χ-modification considered suitable for the coating of tools. In order to prevent the danger of obtaining multiphase aluminum oxide coatings, which presumably occur at temperatures below 1000° C. and which show a considerable mechanical weakness causing premature tool failure, it is proposed that the coating of aluminum oxide consist entirely or at least in proportion of 85% of the χ-modification and that an optional remainder consisting of the α-modification form areas or spots not exceeding a size of 10 μm on the surface. For the deposition the CVD process at temperatures of approximately 1000° C. is suggested. However, this type of coating tends to convert into the α-modification under the action of high temperatures, so that cracks appear in the layer, leading to premature failure especially under the action of hot gas corrosion.

In order to avoid the problems occurring at high deposition temperatures, the DE 32 34 943 discloses the deposition of an amorphous aluminum oxide layer. However, intensive testing with amorphous aluminum oxide layers, deposited by means of PVD, have shown that purely amorphous aluminum oxide layers have a glass-like breaking behavior, and therefore can not offer any significant improvement in wear resistance. In the case of interrupted cuts, these layers tend to split.

In the DE 24 28 530 A1 a process for the protection of a metallic part against corrosion and wear is proposed, which in the pure or alloyed state contains at least one element of the Group I B of the periodic system of elements and wherein on the surface of this part a layer of amorphous and transparent aluminum oxide is deposited by chemical deposition from the vapor phase. However the amorphous layers applied at temperatures between 300° and 800° C. are far less stable when subjected to thermal influences than for instance the modification of the aluminum oxide ($\alpha$-$Al_2O_3$) known as corundum.

Basically it is also known to use aluminum oxide layers as protective layers against hot gas corrosion, for instance in internal combustion engines. In this case special requirements exist not only with regard to the mechanical stability of the layer, but also to the density of the layer. According to the state of the art this can be achieved only by comparatively thick (approximately 500 μm) ceramic layers produced through thermal spraying.

OBJECTS OF THE INVENTION

It is therefore the object of the present invention to improve the aforementioned composite body with regard to its protective action and mechanical wear properties.

SUMMARY OF THE INVENTION

This task is achieved with the composite body consisting of a ceramic, sintered ceramic or cermet substrate body or a substrate body made of diamond or a nickel- or cobalt-based alloy and at least one aluminum oxide surface layer with a fine crystalline structure and which has been applied by a plasma-activated CVD process at substrate temperatures of 400° to 750° C., preferably of 450° C. to 550° C., with a plasma activation produced by a pulsed direct voltage at the substrate body connected as cathode.

The aluminum oxide layer consists of fine crystalline $\alpha$-$Al_2O_3$ and/or $\gamma$-$Al_2O_3$ with a grain size of $\leq 50$ nm or of their modifications with fractions of amorphous aluminum oxide.

This composite body presents considerable advantages compared to other composite bodies produced by the PVD or CVD coating processes. Particularly in the case of steels, the CVD process has to be excluded due to the high temperatures at which it is performed, since due to the high coating temperatures the hard structure of the steel is lost, so that afterwards a tempering has to be performed, which brings about the disadvantage of a lesser measurement precision. On the other hand, the PVD process which can be performed at lower temperatures has the disadvantage that in parts with a complicated shape the coating of recesses and blind holes can not be sufficiently uniform. These shading effects can hardly be eliminated, even by rotating the involved parts during coating.

Surprisingly the aluminum oxide layers of the invention show a completely different behavior, which can be attributed only to their fine crystalline structure. Compared to the other theoretically possible coatings with titanium nitride, titanium carbide or titanium carbonitride, the aluminum oxide in its α and/or γ modifications has excellent wear resistance.

Preferably the coating of the composite body is such that the electron diffraction image of the aluminum oxide coating has interference rings which can be related to certain grate planes of $\gamma$-$Al_2O_3$ or $\alpha$-$Al_2O_3$. The observed interference patterns (Debye-Scherrer-rings) correspond unequivocally to the individual lattice planes of the respective crystal phases.

Preferably the composite body has a coating with a particularly fine crystalline structure of the aluminum oxide. A measure for the crystal size is offered by the X-ray diffraction method. When $CuK_\alpha$ radiation is used and at the same angular position $2\theta$ of the ray counter and at the same aperture of the radiation collimator, the line width of the interference lines of the X-ray diffraction diagram is the narrower the bigger the interfering monocrystalline crystallites or the bigger the average grain size of the polycrystalline materials (e.g. of α-aluminum oxide) are. This correlation is described by the formula derived by W. Scherrer $B_{1/2}=k\cdot\lambda/(<d>\cdot\cos\theta)$. $\lambda$ is the wave length of the X-rays., $<d>$ the average linear extent of the reflecting crystallite, $\theta$ the glancing angle and k a constant. The line width of the x-ray diffraction diagram can therefore be used as a measure for the average grain size, particularly in the case of very fine, submicroscopic crystals. The half-value width of the diffraction lines measured with the same X-rays in the testing of a powdery body of $\alpha$-$Al_2O_3$ or of an $\alpha$-$Al_2O_3$ layer applied by a CVD process at 1000° C. to 1100° C. can be considered as a comparative value.

Preferably X-ray diffraction lines indexed by the Miller indexes (113) and occurring at the diffraction angle of 43.4° of the 2θ scale when $CuK_\alpha$ X-rays are used, are considered as a base for measurement, their half-value width, preferably at least fourfold the half-value width of the corresponding X-ray diffraction line of the powdery aluminum oxide, being used as a measure for the fineness of the grain of the tightly packed hexagonal crystalline structure of the aluminum oxide.

Another testing method for the particularly fine crystalline structure of the coating of the invention is based on electron diffraction in an electron microscope. When the size of the crystallites is substantially smaller than the diameter of the electron beam (typical are diameters of approximately 300 nm), a diffraction image with the so-called Debye-Scherrer-rings appears. From the wavelength of the electrons and the diameter of the rings the lattice plane distances of the crystallites can be calculated, which again correspond unequivocally to certain crystal structures. With these methods it has been established that the layers consisted of fine crystalline $\alpha$-$Al_2O_3$ or $\gamma$-$Al_2O_3$. In a few coatings also both of the modifications have been found.

According to a further development of the invention, the thickness of the aluminum oxide layer should be of 0.5 to 10 μm, preferably 1 to 5 μm.

According to a further embodiment of the invention the aluminum oxide coating consists of 49 to 52.5% by mass aluminum, 46 to 47.5% by mass oxygen and o.5 to 3.5 by mass chlorine.

Depending on the intended use protective layers which have been combined with other layers made of carbides, carbonitrides, nitrides, borides and/or oxides of the elements of Groups IV to IVa of the periodic system of elements have proven to be useful. Multilayer coatings of aluminum oxide and titanium carbide, as well as titanium nitride can be used.

For the production of the fine-grained aluminum oxide coating according to the invention a plasma-activated CVD process at substrate temperatures of 400° to 700° C. is used. The plasma activation is produced with a pulsed direct voltage applied at the substrate body functioning as a cathode. The low coating temperatures possible due to the selection of the CVD process lead to an improved adhesion of the aluminum oxide surface layer. The substrate body is completely and evenly coated by the layer, except for the support points, without the shading effect occurring usually in the PVD process. However preferably the coating is performed at temperatures between 450° and 550° C., The pulsed direct voltage has maximal values between 200 and 900 V.

The quality of the coating is further improved due to the fact that between the positive direct voltage pulses (rectangular pulses) in the pulse pauses a residual direct voltage is maintained, which is higher than the lowest ionization potential of the gas molecules participating in the CVD process, but not higher than 50% of the maximal value of the pulsed direct voltage. Hereby what matters is not the voltage curve, or the uniformity of the residual direct voltage, but only the fact that over the entire time period between two rectangular pulses the residual direct voltage is always higher than the mentioned ionization potential. In the following several ionization potentials which are important for the CVD process of aluminum oxide are indicated:

H: 13.5 eV, $H_2$=15.8 eV,

Ar: 15.7 eV,

O: 13.6 eV, $O_2$; 12.1 eV, $AlCl_3$: 11.0 eV.

Preferably the ratio of the residual direct voltage to the maximal value of the pulsed direct voltage ranges between 0.02 and 0.5.

The period duration of the pulsed direct voltage should preferably lie between 20 us and 20 ms, whereby under the period duration one understands the duration of a rectangular pulse and a pulse pause. Preferably the ratio of the pulse duration to the period duration is selected between 0.2 to 0.6. The parameters are finally set so that a layer growth rate of 0.5 to 10 μm/h is reached.

The described process for aluminum oxide coating is already disclosed in principle in the DE 38 41 730 A1 and can also be used for the coating of other hard substances, such as carbides, nitrides, borides, silicides and oxides with an especially high hardness and a high melting point, as are for instance titanium carbide, titanium nitride, titanium carbonitride, zirconium oxide, boron carbide, silicon carbide and titanium diboride. However, it was surprising that in spite of the apprehensions expressed in the prior art literature, the protective layers have an unexpectedly fine-grained α and/or γ aluminum oxide modification.

Preferably as a hard-substance forming reactive gas atmosphere aluminum chloride, carbon dioxide and hydrogen, which are partially ionized by a corona discharge, are used. As a preferred gas pressure during coating 200 to 400 Pascal are set.

The composite body of the invention can be used for various technical purposes. Particularly composite bodies with a cermet substrate body are preferably used as cutting materials for chip-forming machining processes, particularly as indexable inserts. A further application is based on the density and the oxidation resistance of the protective layer. Since the layers produced by the process according to the invention present compressive strains, the coating remains dense even at high temperatures and thereby caused expansion of the substrate body, i.e. no cracks occur. Therefore the protective layer is an excellent material to be used for the lining of combustion chambers.

During extrusion, which technologically is similar to injection molding, in a continuous production flow semifinished products, such as profiles, are produced. The liquid molding mass is pressed through an extrusion tool, which as a rule has a nozzle limiting a casting area or a die, as well as in some cases a coaxial mandrel. Extrusion has proven itself particularly in processing aluminum or aluminum alloys to profiles. However differently from the previously described casting, during extrusion it is not possible to mount cutting means on the tools, which up to now have been mostly made of steel. Therefore especially in steel tools which come directly into contact with the extruded goods up to now also wear or cementing have to be considered, which can be avoided with the coating according to the invention.

BRIEF DESCRIPTION OF THE DRAWINGS

Further development of the invention and the advantages it has over the state of the art are explained in the following with the aid of the drawing, in FIGS. 1 through 4. They show.

Figure 1:
FIG. 1 is a photomicrograph of the structure of the coating of a substrate body—here of a hard metal—with the fine crystalline layer of α-$Al_2O_3$ according to the invention; scanning electron microscope photo, enlargement 8000:1.

The deposited aluminum oxide has a very fine-grained structure. Through examinations with a scanning electron microscope, this structure can be made visible. As shown by FIG. 1, the protective layer according to the invention has a very fine structure, free of pores or cracks.

Figure 2:
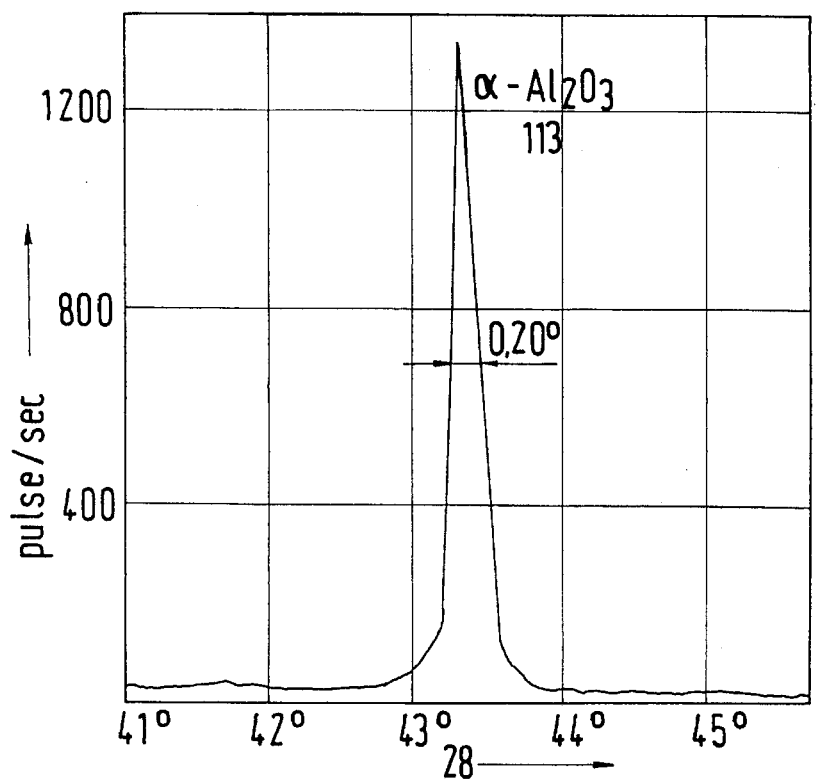
FIG. 2 is the line profile of compact aluminum oxide sampling according to the prior art.
Figure 3:
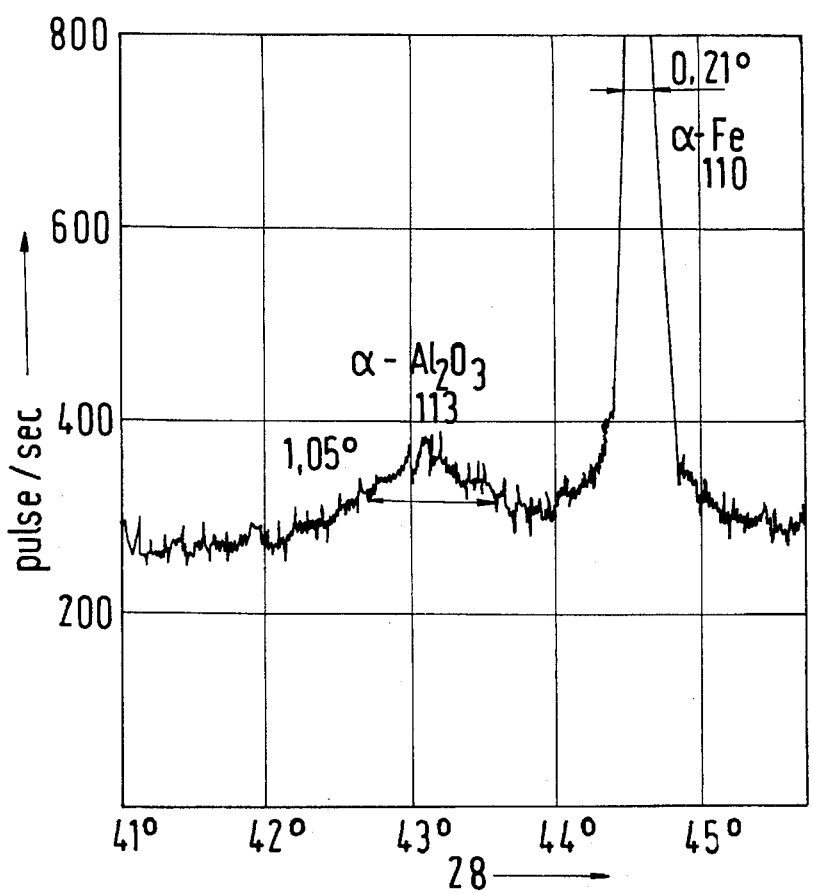
FIG. 3 is the line profile of the protective α-aluminum oxide layer on a steel substrate.
Figure 2:
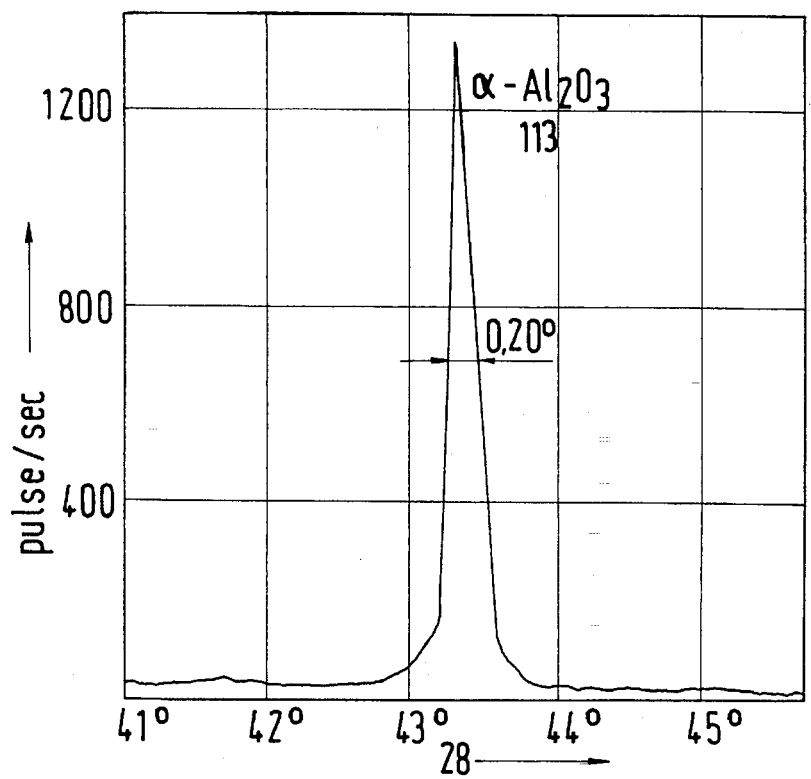
Figure 3:
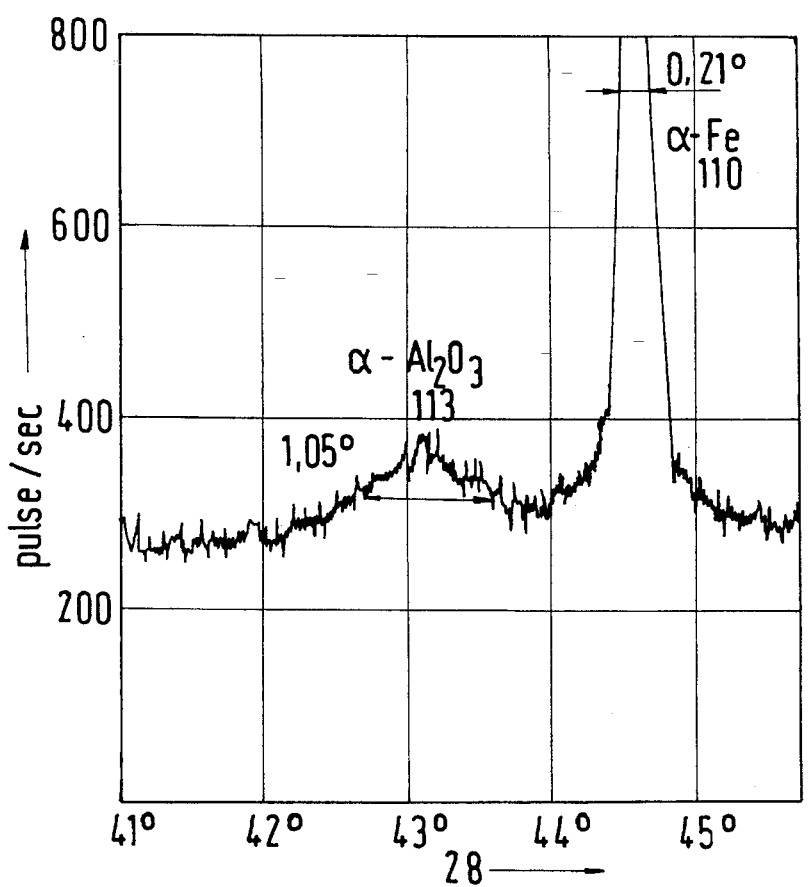

Prior to explanation of FIGS. 2 and 3, it has to be said that each crystalline structure, such as α-$Al_2O_3$ or the γ-$Al_2O_3$ at certain diffraction angles 2θ, present the interference lines characterized by the so-called Miller indices. For instance in the case of γ-$Al_2O_3$ at other diffraction angles 2θ than in α-$Al_2O_3$ different interference lines which are specific to the structure appear, so that an X-ray diffraction diagram can be considered as a kind of fingerprint for the identification of crystalline structures and modifications of a solid substance.

As already mentioned before the half-value widths are in directly proportional interdependence with the average size of the reflecting crystal.

FIG. 2 shows a cutout of the line profile of a compact aluminum oxide body. The half-value line width of the (113) reflex equals 0.2° of the 2θ scale when $CuKa_α$ radiation is used.

In opposition thereto the half-value width of the α-$Al_2O_3$ line of the (113) reflex of a sample produced according to the invention 1.05° of the 2θ scale (see FIG. 3). Therefore composite bodies with the α-$Al_2O_3$ coating according to the invention have a line width which is at least three times, in the present case five times the natural line width occurring in compact bodies (see FIG. 3).

Figure 4:
FIG. 4 is an electron diffraction image of a γ-$Al_2O_3$ layer according to the invention.

FIG. 4 shows an electron diffraction image of a layer according to the invention. From the diameter of the diffraction rings the lattice plane distances $d_{obs}$ shown in the following table are determined.

| Index nkl | $d_{obs}$ nm | $d_{calc.}$ nm |
|---|---|---|
| 311 | 0.2393 | 0.2384 |
| 400 | 0.1979 | 0.1977 |
| 511, 333 | 0,1525 | 0.1522 |
| 440 | 0.1398 | 0.1398 |
| 622 | 0.1192 | 0.1192 |
| 444 | 0.1137 | 0.1142 |
| 800 | 0.0986 | 0.0988 |

With the assistance of the lattice constant known from the literature of γ-$Al_2O_3$ (a=0.7908 nm) the lattice plane distances have been calculated ($d_{calc.}$) and compared to the observed $d_{obs}$. The consistency of dobscalc proves that the applied layer consists of the γ-$Al_2O_3$ modification.

In a concrete application example sample bodies made of steel 1.2343, coated with various layers according to different processes were immersed in a liquid aluminum alloy AlMgSi0.5 (Temperature T=700° C.).

1. Steel 1.2343: Strong interaction between the aluminum melt and the steel in the contact area. After cooling a nondetachable coating of aluminum
2. Steel 1.2343+5 μm TiN (PVD): Dissolution of the TiN layer in the melt
3. Steel 1.2343+5 μm TiN (PCVD): Dissolution of the TiN layer in the melt
4. Steel 1.2343+4 μm TiC (PCVD): Dissolution of the TiC layer in the melt
5. Steel 1.2343+5 μm Ti (C,N) (PCVD): Dissolution of the Ti(C,N) layer in the melt
6. Steel 1.2343+6 μm aluminum oxide (CVD, T<700/C): The aluminum oxide layer with the thereon adhering cooled aluminum melt detaches itself from the substrate
7. Steel 1.2343+6 μm aluminum oxide (PCVD, T=400°–700° C.): The layer remains stable. There is no decomposition, melting or detaching of the layer. Reduced interaction between the aluminum melt and the layer in the contact area, reduced cementing tendency, when the melt residuals are pulled off the die the aluminum oxide layer of the invention remains firmly attached to the substrate material.

Based on these positive results, for the production of housing parts from GD-AlSi12 uncoated dies made of steel 1.2484 then coated according to the described pulsed plasma CVD process with the aluminum oxide layer of the invention have been used. The aluminum oxide layer was deposited at a temperature of T=500° C. The layer thickness was 4 μm. A coated die as well as an uncoated die were sprayed prior to the casting process with a commercially available parting agent. After the casting is removed, it has been found that even when the uncoated die has been carefully lined with the parting agent, caking occurs at many locations. In the die coated with the aluminum oxide layer of the invention no caking occurred, the cast part could be removed from the die without problems and therefore the die could be cleaned without difficulties. On the contrary in the case of the uncoated die the cleaning of the described cakings was much more difficult and time-consuming.

Usually dies made of steel 1.2343 are used in the extrusion of aluminum profiles.

The here-described profiles are produced from an AlMgSi0.5 at an extrusion temperature of T of 520° C. In a highly complicated process the extrusion temperature, the pressing power and the flow velocity are kept constant within narrow tolerances by computer control. Small deviations in the forming channels, caused for instance by the wear of the dies, lead to quality loss and with it the end of tool life and to the replacement of the expensive dies. Since in this process parting agents can not be used, the direct interaction between the die material and the material of the profiles to be formed is of decisive importance. In the production of the above-described aluminum profiles comparative tests have been conducted with uncoated dies and with dies coated with the aluminum oxide layer of the invention according to the pulsed plasma CVD process. The coating temperatures were at T=450° C., the layer thickness was 3 µm. While profiles of a total length of 4 km could be drawn with the uncoated dies, with the dies coated by the aluminum oxide layer according to the invention a tool life travel of 10 km was reached.

In a concrete application example sample bodies made of steel 1.2343, coated with various layers according to different processes were immersed in a liquid aluminum alloy AlMgSi0.5 (Temperature T=700° C.).

1. Steel 1.2343: Strong interaction between the aluminum melt and the steel in the contact area. After cooling a nondetachable coating of aluminum
2. Steel 1.2343+5 µm TiN (PVD): Dissolution of the TiN layer in the melt
3. Steel 1.2343+5 µm TiN (PCVD): Dissolution of the TiN layer in the melt
4. Steel 1.2343+4 µm TiC (PCVD): Dissolution of the TiC layer in the melt
5. Steel 1.2343+5 µm Ti (C,N) (PCVD): Dissolution of the Ti(C,N) layer in the melt
6. Steel 1.2343+6 µm aluminum oxide (CVD, T<700/C): The aluminum oxide layer with the thereon adhering cooled aluminum melt detaches itself from the substrate
7. Steel 1.2343+6 µm aluminum oxide (PCVD, T=400°–700° C.): The layer remains stable. There is no decomposition, melting or detaching of the layer. Reduced interaction between the aluminum melt and the layer in the contact area, reduced cementing tendency, when the melt residuals are pulled off the die the aluminum oxide layer of the invention remains firmly attached to the substrate material.

Based on these positive results, for the production of housing parts from GD-AlSi12 uncoated dies made of steel 1.2484 then coated according to the described pulsed plasma CVD process with the aluminum oxide layer of the invention have been used. The aluminum oxide layer was deposited at a temperature of T=500° C. The layer thickness was 4 µm. A coated die as well as an uncoated die were sprayed prior to the casting process with a commercially available parting agent. After the casting is removed, it has been found that even when the uncoated die has been carefully lined with the parting agent, caking occurs at many locations. In the die coated with the aluminum oxide layer of the invention no caking occurred, the cast part could be removed from the die without problems and therefore the die could be cleaned without difficulties. On the contrary in the case of the uncoated die the cleaning of the described cakings was much more difficult and time-consuming.

Usually dies made of steel 1.2343 are used in the extrusion of aluminum profiles.

The here-described profiles are produced from an AlMgSi0.5 at an extrusion temperature of T 0 520° C. In a highly complicated process the extrusion temperature, the pressing power and the flow velocity are kept constant within narrow tolerances by computer control. Small deviations in the forming channels, caused for instance by the wear of the dies, lead to quality loss and with it the end of tool life and to the replacement of the expensive dies. Since in this process parting agents can not be used, the direct interaction between the die material and the material of the profiles to be formed is of decisive importance. In the production of the above-described aluminum profiles comparative tests have been conducted with uncoated dies and with dies coated with the aluminum oxide layer of the invention according to the pulsed plasma CVD process. The coating temperatures were at T=450° C., the layer thickness was 3 µm. While profiles of a total length of 4 km could be drawn with the uncoated dies, with the dies coated by the aluminum oxide layer according to the invention a tool life travel of 10 km was reached.

We claim:
1. A composite body which comprises
(a) a ceramic, sintered ceramic or cermet substrate body or a substrate body made of diamond or a nickel-based or cobalt-based alloy; and
(b) at least one surface layer composed of at least one aluminum oxide with a grain size of at most 50 nm selected from the group which consists of fine crystalline γ-aluminum oxide and α-aluminum oxide, and γ-aluminum oxide modified with a fraction of amorphous alumina and α-aluminum oxide modified with a fraction of amorphous alumina deposited by plasma CVD at a substrate temperature of 400° to 750° C., with the substrate body connected as cathode and with a plasma activation produced by a pulsed direct voltage.

2. The composite body defined in claim 1 wherein the surface layer composed of at least one aluminum oxide with a grain size of at most 50 nm is composed of fine crystalline γ-aluminum oxide or α-aluminum oxide applied to the substrate body at a temperature of 450° to 550° C.

3. The composite body defined in claim 1 wherein the electron diffraction image of the aluminum oxide coating shows interference rings of singular lattice phases of γ-aluminum oxide or α-aluminum oxide.

4. The composite body defined in claim 1 wherein the surface layer composed of at least one aluminum oxide with a grain size of at most 50 nm is composed of α-aluminum oxide with diffraction lines measured by CuK α-radiation having a half-value width at least three times greater than a half-value width of a powdery compact body of α-aluminum oxide or of an α-aluminum oxide layer applied by CVD at 1000° to 1100° C.

5. The composite body defined in claim 1 wherein an X-ray diffraction line indexed via the Miller indices and occurring at a diffraction angle 43.4 degrees of the 2θ scale when CuK α radiation is used, is at least triple the half-value width of the corresponding X-ray diffraction line of powdery α-aluminum oxide.

6. The composite body defined in claim 5 wherein the X-ray diffraction line indexed via the Miller indices and occurring at a diffraction angle 43.4 degrees of the 2θ scale when CuK α radiation is used, is at least four times the half-value width of the corresponding X-ray diffraction line of the powdery α-aluminum oxide.

7. The composite body defined in claim 1 wherein the thickness of the surface layer is at least 0.5 to 10 microns.

8. The composite body defined in claim 1 wherein the aluminum layer consists of 49 to 52.5% by mass aluminum, 46 to 47.5% by mass oxygen, and 0.5 to 3.5% by mass chlorine.

9. The composite body defined in claim 1 which includes at least one other layer of a carbide, carbonitride, nitride, boride, or oxide of the elements Ti, Zr, Hf, V, Nb, Ta, Cr, Mo, or W on the substrate body.

10. The composite body defined in claim 9 wherein said other layer consists of TiC, TiN or TiC and TiN.

11. The composite body defined in claim 1 characterized in that the surface layer that borders the substrate body is an aluminum oxide layer.

12. The composite body defined in claim 11 wherein the surface layer is an outer layer above another layer and consists of fine crystalline γ-aluminum oxide or α-aluminum oxide with a grain size $\leq 50$ nm.

13. Use of the composite body according to claim 1 as a cutting material for chip-forming machining.

14. A method of machining comprising the steps of:

forming a tool by applying to a substrate body of a ceramic, sintered ceramic, cermet, diamond, nickel-based alloy or cobalt-based alloy, at least one surface layer by connecting the substrate body as a cathode and subjecting the substrate body to plasma chemical vapor deposition at a substrate temperature of 400° to 750° C. with plasma activation produced by pulsed direct voltage to deposit a fine crystalline γ-aluminum oxide or α-aluminum oxide with a grain size of at most 50 nm or γ-aluminum oxide or α-aluminum oxide modified with fractions of amorphous alumina; and machining a workpiece in a chip-forming machining operation using said composite body as a tool.

* * * * *